United States Patent [19]

Moss

[11] Patent Number: 5,745,041

[45] Date of Patent: Apr. 28, 1998

[54] SYSTEM FOR DISSIPATING HEAT FROM A POWER SUPPLY

[75] Inventor: David L. Moss, Austin, Tex.

[73] Assignee: Dell U.S.A., L.P., Austin, Tex.

[21] Appl. No.: 853,192

[22] Filed: May 8, 1997

Related U.S. Application Data

[63] Continuation of Ser. No. 499,887, Jul. 11, 1995, abandoned.

[51] Int. Cl.$^6$ .................................................. G08B 21/00
[52] U.S. Cl. .................... 340/635; 340/507; 340/621; 361/687; 361/688; 361/694; 361/695
[58] Field of Search .......................... 340/635, 648, 340/504, 507, 621; 361/687, 695, 684, 688, 694

[56] References Cited

U.S. PATENT DOCUMENTS

| | | | |
|---|---|---|---|
| 4,401,351 | 8/1983 | Record | 361/395 |
| 4,751,872 | 6/1988 | Lawson, Jr. | 361/384 |
| 4,847,600 | 7/1989 | Nixon | 340/621 |
| 5,121,291 | 6/1992 | Cope et al. | 361/384 |
| 5,287,009 | 2/1994 | Heung | 361/695 |
| 5,287,244 | 2/1994 | Hileman et al. | 361/687 |
| 5,436,827 | 7/1995 | Gunn et al. | 361/695 |
| 5,438,226 | 8/1995 | Kuchta | 361/695 |
| 5,444,436 | 8/1995 | Kennison | 340/635 |

Primary Examiner—Jeffery Hofsass
Assistant Examiner—Davetta Woods
Attorney, Agent, or Firm—Haynes and Boone, L.L.P.

[57] ABSTRACT

A system for dissipating heat from a power supply enclosed within a housing having an air inlet and outlet. The system includes fans disposed in a plenum structure adapted to fit over the housing to thereby establish air communication between the fans and the housing inlet so that operation of the fans causes air to flow through the inlet, the power supply, and out through the outlet, thereby dissipating heat from the power supply. Each fan is operable independent of any other of the fans. The relationship between the fans may be serial, parallel, or a combination of serial and parallel. The fans are monitored to detect failure of any of the fans and, upon such detection, an alert is activated.

24 Claims, 2 Drawing Sheets 5,745,041

SYSTEM FOR DISSIPATING HEAT FROM A POWER SUPPLY

This is a continuation of application Ser. No. 08/499,887, filed Jul. 11, 1995, now abandoned.

TECHNICAL FIELD

The invention relates generally to a system for dissipating heat from a power supply and, more particularly, to such a system suitable for dissipating heat from a personal computer power supply.

BACKGROUND OF THE INVENTION

Electrical power is typically made available to a consumer as alternating current (AC) in only a limited number of voltages (V), such as 120 V AC. Electrical equipment, however, commonly requires direct current (DC) at a different voltage. To meet such requirements, power supplies are typically provided to convert AC at one voltage to DC at another voltage. For example, power supplies for personal computers (PCs) typically convert electrical power from 120 V AC to 5 V DC.

Power supplies form a critical component in many electrical devices, such as computers, that comprise electrically sensitive semiconductor devices. It is therefore important that power supplies perform to very exacting specifications. The performance of a power supply can be affected by a number of factors, the most common of which is its temperature. If the temperature of a power supply is not controlled, i.e., if heat generated by a power supply is not dissipated, a power supply can overheat and malfunction. As a further consequence, a PC drawing power therefrom can be damaged and valuable data can be lost. Accordingly, arrangements are typically provided for cooling power supplies to prevent them from overheating.

Early PC power supplies were cooled by an external fan which was adapted to cool other components of the PC as well. More recently, PC power supplies have become larger and therefore require dedicated internal fans to maintain adequate cooling. These power supplies, equipped with internal fans integrated into the power supply housing, are typically sold to the PC manufacturer as a prepackaged unit that is installed in the PC at the factory. A problem with such power supplies though is that they can overheat and fail if the internal fan malfunctions.

One solution to the potential failure of the power supply in a PC is to build the PC with a redundant power supply as a backup should one power supply fail. Thus if one power supply overheats and fails, the second, redundant power supply can sustain an uninterrupted supply of power to the computer. However, there are several drawbacks associated with such a redundant power supply system. For example, special additional circuitry is required to control and coordinate the operation of the two power supplies working together and, as a result, the cost of a redundant power supply system is significantly greater than that of a single power supply system. Furthermore, a redundant power supply system can consume, in the limited space inside a PC, more than twice as much valuable space as a single power supply system and, furthermore, can add significantly to the weight of the PC. Due to such relatively large cost, size, and weight, redundant power supplies are not the best solution to improving the reliability of supplying DC power to computer circuitry.

Therefore, what is needed is a relatively low-cost, small volume, lightweight system for improving the reliability of a PC power supply. Particularly, what is needed is a system that improves the reliablity of cooling of a power supply in addition to the cooling already afforded by commercially available, prepackaged power supplies.

SUMMARY OF THE INVENTION

The present invention, accordingly, provides a system utilizing auxiliary fans for dissipating heat from a power supply that overcomes or reduces disadvantages and limitations associated with prior power supply cooling systems.

One aspect of the invention is an apparatus for dissipating heat from a power supply, where the power supply is enclosed in a housing that includes at least one opening for passage of air therethrough. A plenum structure is adaptable to fit over the at least one opening of the housing. The plenum structure includes at least one fan for moving air through the at least one opening so that air passes over the power supply. The apparatus further includes an arrangement for signaling malfunction of the at least one fan.

In another aspect, the signaling arrangement includes circuitry for detecting malfunction of the at least one fan, and an arrangement operatively connected to the circuitry for generating a user alert upon malfunction detection. In one embodiment a computer display is operatively connected to the malfunction detecting circuitry so that the alert generating arrangement provides an alert in the form of a notice that appears on the display.

In yet another aspect, the fans are independently operable and the relationship between the fans may be serial, parallel, or a combination of serial and parallel.

A technical advantage achieved with the present invention is that the reliability of a power supply is greatly increased.

Another technical advantage achieved with the present invention is low cost, size, and weight relative to a redundant power supply system.

Another technical advantage achieved is that notice of auxiliary fan failure enables correction by the user without damage to electrical components or, in the case of a PC, without loss of critical data.

DETAILED DESCRIPTION OF THE PREFERRED EMBODIMENT

Figure 1:
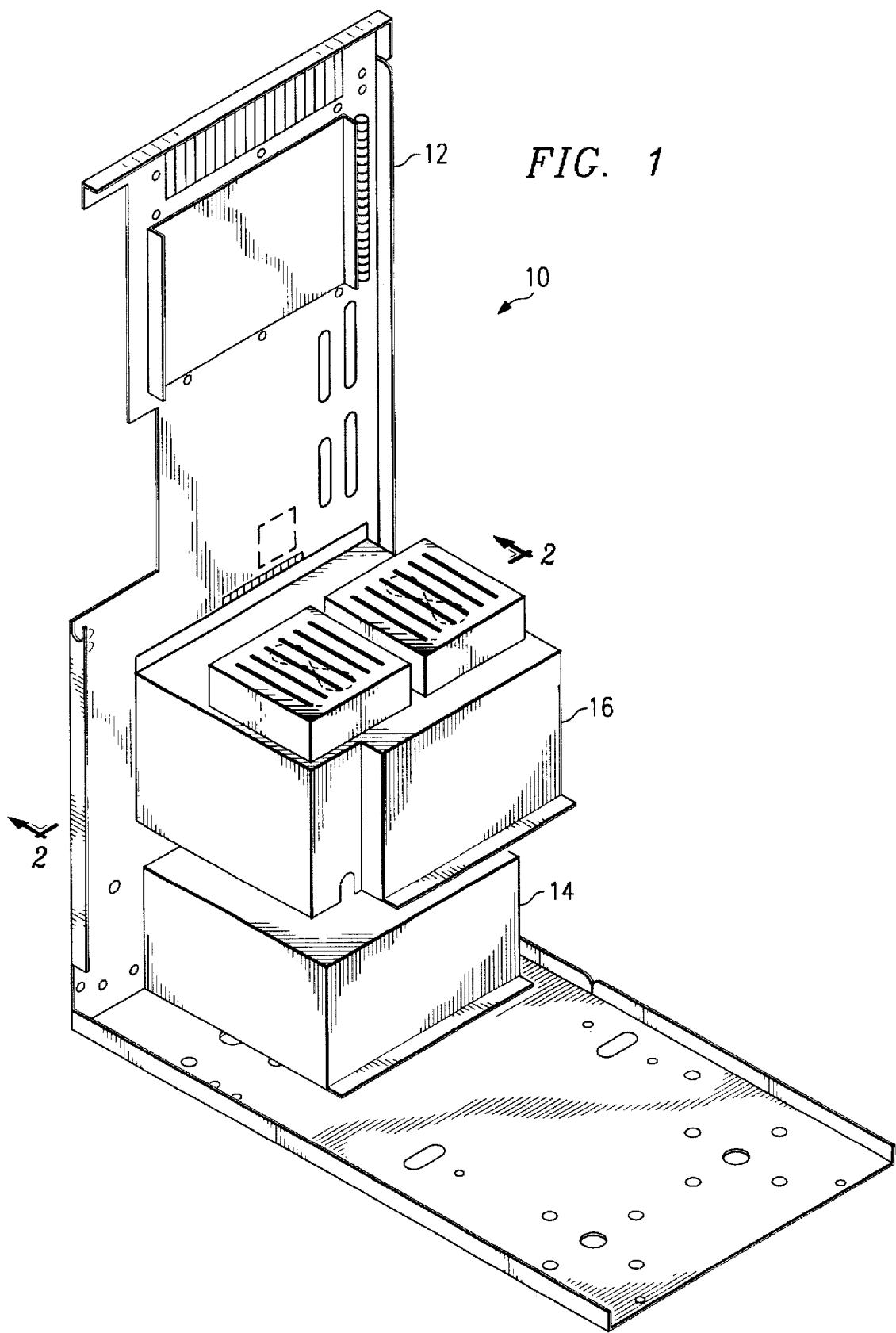
FIG. 1 is a perspective view of a portion of a personal computer utilizing a system for dissipating heat from a power supply according to the present invention.
Figure 2:
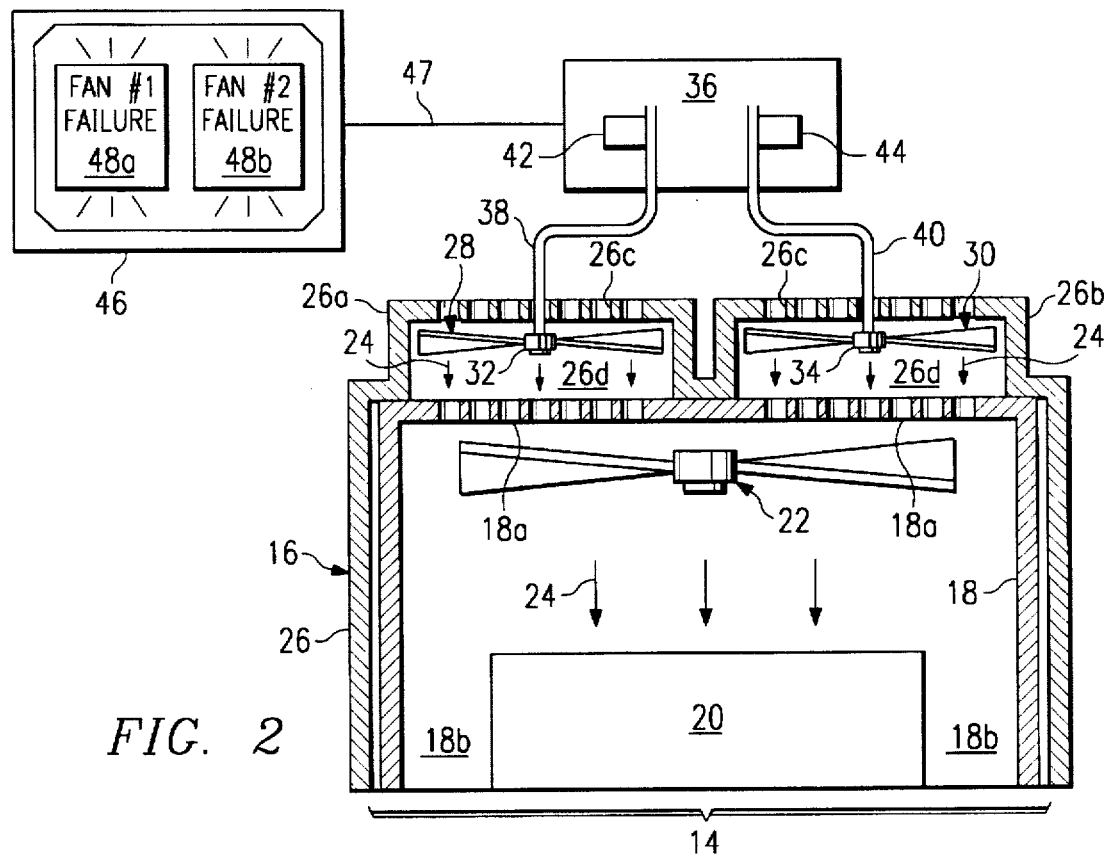
FIG. 2 is an enlarged, cross-sectional, elevational view of the heat dissipating system of FIG. 1 taken along the line 2—2 of FIG. 1.

In FIG. 1 the reference numeral 10 refers to a portion of a personal computer (PC) embodying features of the present invention. The PC 10 includes a "tower" chassis 12 and a power supply 14 secured to the chassis in a conventional manner. A cooling system 16, described subsequently in detail, is illustrated (for clarity) as being elevated above the power supply 14, it being understood that in assembly the cooling system rests over the power supply as shown in FIG. 2. While not shown, the PC 10 also includes electrical components within the chassis 12 that are connected to the power supply 14 as needed to make the PC operative including, for example, a system board, a central processing unit (CPU), drives and the like. Since these components are conventional, they will not be described further.

Referring also to FIG. 2, the power supply 14 includes a housing 18, a transformer 20, rectifier circuitry (not shown), and an internal fan 22 integrated into the interior top portion of the housing. Air inlets 18a and air outlets 18b are defined in the housing 18 and are sized and arranged to facilitate the flow of air over the transformer 20 to dissipate heat therefrom. It is understood that the fan 22 includes a support structure and electric motor (not shown) for supporting and operating the fan 22 in a manner well known in the art to draw air into the housing 18 through the inlets 18a and to direct the air downwardly in a direction of arrows 24 over the transformer 20 and out through the outlets 18b.

The system 16 includes a plenum 26 that comprises a metal structure having two inverted well portions 26a, 26b, air inlets 26c formed in the well portions 26a, 26b, and an air outlet 26d formed generally by the space therebelow. The plenum 26 is adapted to sealingly fit over the housing 18 to thereby establish air communication between the plenum air inlets 26c and the power supply housing air inlet 18a. The system 16 further includes two auxiliary fans 28, 30 disposed within the well portions 26a, 26b, respectively. It is understood that support structures (not shown) are provided for supporting the fans 28, 30 in the well portions 26a, 26b. The fans 28, 30 include respective electric motors 32, 34 housed in hubs of the fans 28, 30. Each of the motors 32, 34 independently receives electrical power from a PC system board 36 via wires 38, 40 connected thereto so that each fan 28, 30 can operate independently of the other. The system board 36 is provided with conventional current sensors 42, 44 coupled in series with the wires 38, 40 for gauging the current that flows through the motors 32, 34. The fans 28, 30 are so arranged in the plenum 26 that, upon receiving power via the wires 38, 40, air is drawn in through the air inlets 26c. The air is directed downwardly in the direction of the arrows 24, out through the air outlet 26d, through the supply inlets 18a, over the transformer 20 and out through the outlets 18b. A display 46 of the computer 10 is operatively coupled by line 47 to the board 36 so that upon failure or malfunction of the fans 28, 30, respective warning boxes 48a, 48b appear on the display as an alert, i.e., a notice, to the user of the malfunction. While not shown, it is understood the board 36 includes circuitry and software necessary for generating the warning boxes 48a, 48b responsive to the malfunction condition. Since the circuitry and software contained on the board 36 for performing this function is readily understood by one skilled in the art in possession of the present disclosure, no further discussion thereof is necessary.

The auxiliary fans 28, 30 are sized so that either fan 28, 30 alone can cause sufficient air to flow through the power supply 14 to dissipate heat generated therefrom. Apart from their use in the present invention, the fans 28, 30 are of conventional design and are therefore not described in any further detail.

In operation, the power supply 14 receives 120 V of AC power from an external source (not shown) and converts it to 5 V of DC power for use by the PC 10 in a manner well known in the art. In the conversion process, the transformer 20 generates a substantial quantity of heat. The internal fan 22 draws in air from the air inlet 18a at ambient temperature and directs it over the transformer 20 to thereby dissipate heat generated by the transformer 20. The auxiliary fans 28, 30 supplement the internal fan 22 so that, should the internal fan 22 fail, air will continue to be directed over the transformer 20 to prevent the transformer 20 from overheating and damaging the entire PC 10.

The current sensors 42, 44 on the system board 36 monitor the current flowing through the fan motors 32, 34 and generate a signal to the PC 10 indicative of the current sensed. The PC 10 includes instructions (not shown) programmed therein to determine whether the current indicated by the signals falls within a predetermined normal operating range and, if it is not, to generate an alert indicative of a malfunction of one or both of the fans 28, 30. The alert generated could be any of a number of conventional types of alerts such as, for example, an audible alert or a visual alert such as the illumination of a light emitting diode (LED) or the display of a notice such as the boxes 48a, 48b on the display 46. In the event of an alert indicating failure of one or both of the fans 28, 30, the user has an opportunity to replace the system 16, or secure data and power down the computer 10, before the power supply 14 overheats and fails.

Several levels of safety are thus provided by the system 16. Typically, the power supply 14 does not include its own warning system to indicate overheating should the internal fan 22 malfunction and, without the system 16, the user would not be able to anticipate failure of the power supply 14. However, should the internal fan 22 fail, the auxiliary fans 28, 30 of the system 16 are operating to cool the power supply 14. If one of the auxiliary fans 28, 30 fails, an alert such as box 48a or box 48b indicates the failed condition of that fan to the user, although cooling of the power supply is still maintained by the other of the fans 28, 30. Thus with one of the auxiliary fans 28, 30 still operating, the user has plenty of time to repair the system 16 without risk of power supply 14 failure. If the other of the fans 28, 30 then fails, an alert to the user (box 48a, or box 48b) indicates its failure. An alert that both fans 28, 30 have failed (both boxes 48a, 48b) indicates to the user that immediate action is required to replace the system 16 before the power supply 14 overheats.

Figure 3:
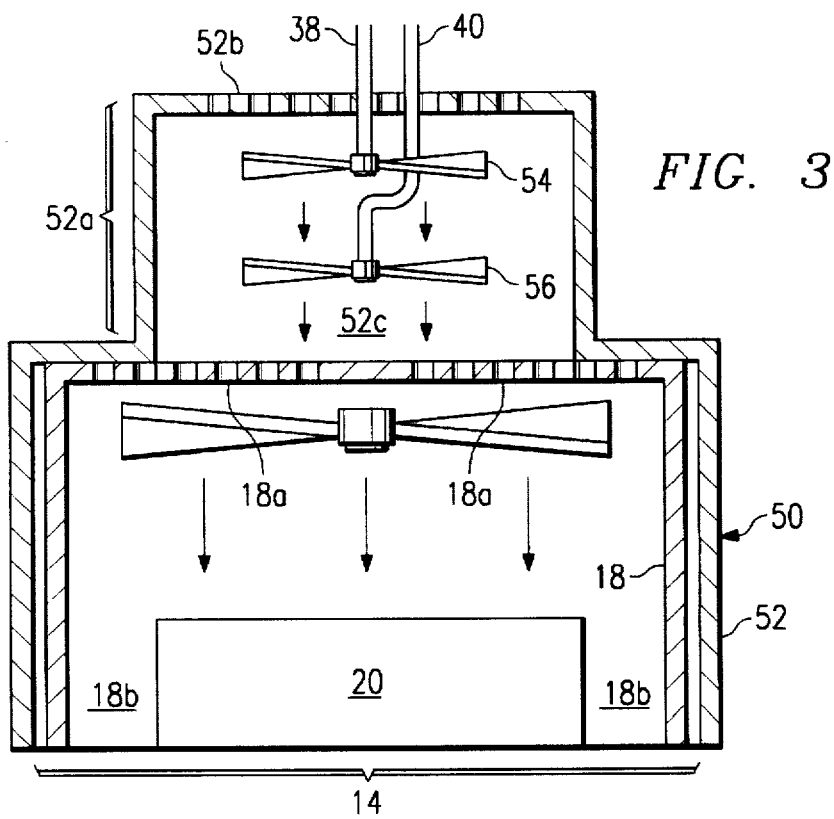
FIG. 3 is an enlarged, cross-sectional, elevational view of an another embodiment of the heat dissipating system of FIG. 1.

FIG. 3 depicts the details of a cooling system 50 according to another embodiment of the present invention. Since the system 50 contains many components that are identical to those of the previous embodiment, these components are referred to by the same reference numerals and will not be described in any further detail. According to the embodiment of FIG. 3, a plenum 52 is provided having a single extended inverted well portion 52a, an air inlet 52b defined in the well portion 52a, and an outlet 52c. The plenum 52 is adapted to sealingly fit onto the power supply 14 to thereby establish air communication between the outlet 52c and the inlet 18a. Two auxiliary fans 54, 56, similar to the auxiliary fans 28, 30, are disposed in a serial relationship so that air may pass sequentially through the fans 54, 56.

The alternate embodiment of FIG. 3 operates similarly to the first embodiment. Specifically, air is drawn by the fans 54, 56 into the plenum inlet 52b, through the fans 54, 56, the plenum outlet 52c, the power supply housing inlet 18a, over the transformer 20, and out through the power supply housing outlet 18b to dissipate heat from the power transformer 20. While the serial arrangement of the fans 54, 56 includes similar advantages as the previous embodiment, there are some additional advantages, namely, that a failed fan 54 or 56 will not become a "path of least resistance" for air flow generated by an operating fan 54 or 56, thereby bypassing the transformer 20, as could occur with a parallel arrangement of fans.

The present invention, as described herein, has many advantages over the prior art. For example, the reliability of a power supply utilizing the cooling system 16 of the present invention is comparable to that of a redundant power supply, but at a fraction of the cost, size, and weight of a redundant power supply system. Further, several levels of safety are provided in that three fans must fail before power supply cooling is compromised. Also, if the internal fan of a power supply fails, the cooling system of the present invention eliminates the requirement and expense of replacing the power supply. In addition, the use of alerts on the display of the computer of fan failure offer convenience to the user in warning of power supply problems.

It is understood that the present invention can take many forms and embodiments. The embodiments shown herein are intended to illustrate rather than to limit the invention, it being appreciated that variations may be made without departing from the spirit or the scope of the invention. For example, the system may provide for sensors to detect whether the internal fan of the power supply fails. Malfunction detection circuitry may include voltage sensors for determining whether the voltage potential across the motor of the fan is within a predetermined range. The system may be designed so that the auxiliary fans operate only if the internal power supply fan fails. One auxiliary fan or two or more auxiliary fans may be utilized and arranged in a combination of serial or parallel relationships. The fans may be alternatively configured to operate via gears or belts drivingly connected to motors not disposed in the hubs of the fans. The fans may be arranged to draw air from the power supply 14 rather than direct air into the power supply 14, or fans may be arranged to both direct air into, and draw air from, the power supply 14. The system 16 may be retrofitted onto existing power supply systems or integrated into power supply systems by a manufacturer. The system 16 may also be adapted for use on a redundant power supply system.

Although illustrative embodiments of the invention have been shown and described, a wide range of modification, change and substitution is intended in the foregoing disclosure and in some instances some features of the present invention may be employed without a corresponding use of the other features. Accordingly, it is appropriate that the appended claims be construed broadly and in a manner consistent with the scope of the invention.

What is claimed is:

1. Apparatus for dissipating heat from a power supply mounted in a chassis, the power supply enclosed in a housing that includes at least one opening and a main fan for drawing air through the opening for cooling the power supply, the apparatus comprising:
   a plenum structure configured to fit over said housing in the chassis;
   at least one auxiliary fan mounted in said plenum structure adjacent to and in a stacked position with the main fan for moving air through said at least one opening so that air passes over said power supply resulting from operation of the main fan and the auxiliary fan; and
   means for signaling malfunction of said auxiliary fan to a user.

2. The apparatus of claim 1 wherein said signaling means comprises:
   circuitry for detecting malfunction of said auxiliary fan; and
   means operatively connected to said circuitry for generating a user alert upon said malfunction detection.

3. The apparatus of claim 2 further comprising a computer display operatively connected to said alert generating means, said alert comprising a notice that appears on said display.

4. The apparatus of claim 2 wherein said detecting circuitry comprises at least one current sensor for determining whether the current passing through the motor of said auxiliary fan is within a predetermined range.

5. The apparatus of claim 2 wherein said detecting circuitry comprises at least one voltage sensor for determining whether the voltage potential across the motor of said auxiliary fan is within a predetermined range.

6. The apparatus of claim 1 wherein said at least one fan comprises two fans located in a parallel relationship for moving air through said auxiliary opening.

7. The apparatus of claim 1 wherein said at least one fan comprises two fans located in a serial relationship for moving air through said auxiliary opening.

8. The apparatus of claim 1 wherein said auxiliary fan moves said air through said opening into said housing.

9. The apparatus of claim 1 wherein said at least one fan moves said air through said opening out of said housing.

10. Apparatus for dissipating heat from a power supply mounted in a chassis, the power supply being enclosed in a housing that includes at least one opening and a main fan for drawing air through the opening for cooling the power supply, the apparatus comprising:
    a plenum structure configured to retro-fit over said housing mounted in a chassis, and defining a cavity for receiving said housing
    first and second auxiliary fans mounted in said plenum structure adjacent to and in a stacked position with the main fan for location over said at least one opening, said auxiliary fans being configured for moving air through said at least one opening so that air passes over said power supply resulting from operation of the main fan and the auxiliary fans;
    such that upon malfunction of one of said auxiliary fans, the other auxiliary fan and the main fan enable a sufficient amount of air to pass over said power supply to adequately dissipate heat therefrom; and
    means for signaling malfunction of one of said auxiliary fans to a user.

11. The apparatus of claim 10 wherein upon malfunction of said main fan, said auxiliary fans, individually or in combination, operate to enable a sufficient amount of air to pass over said power supply to adequately dissipate heat therefrom.

12. The apparatus of claim 10 wherein said signaling means comprises:
    circuitry for detecting malfunction of either or both of said auxiliary fans; and
    means operatively connected to said circuitry for generating a user alert upon said malfunction detection.

13. The apparatus of claim 12 further comprising a computer display operatively connected to said alert generating means, said alert comprising a notice that appears on said display.

14. The apparatus of claim 12 wherein said detecting circuitry comprises current sensors for determining whether the current passing through the motors of said at auxiliary fans is within a predetermined range.

15. The apparatus of claim 12 wherein said detecting circuitry comprises voltage sensors for determining whether the voltage potential across the motors of said auxiliary fans is within a predetermined range.

16. The apparatus of claim 10 wherein said auxiliary fans are located in a parallel relationship for moving air through said at least one opening.

17. The apparatus of claim 10 wherein said auxiliary fans are located in a serial relationship for moving air through said at least one opening.

18. Apparatus for dissipating heat from a power supply mounted in a chassis of a personal computer, said computer having a display, the apparatus comprising:

a housing enclosing said power supply, said housing including at least one opening and a main fan for drawing air through the opening for cooling the power supply;

a plenum structure configured to fit over said housing in the chassis, said plenum structure defining a cavity for receiving said housing, and including first and second auxiliary fans for location adjacent to and in a stacked position with said main fan, said auxiliary fans being configured for moving air through said housing and said at least one opening so that air passes over said power supply resulting from operation of the main fan and the auxiliary fans;

such that upon malfunction of one of said auxiliary fans, the other auxiliary fan and the main fan enable a sufficient amount of air to pass over said power supply to adequately dissipate heat therefrom;

circuitry for detecting malfunction of one of said auxiliary fans; and means operatively connected to said circuitry for generating a user alert in the form of a notice on said display upon said malfunction detection.

19. The apparatus of claim 18 wherein upon malfunction of said main fan, said auxiliary fans, individually or in combination, operate to enable a sufficient amount of air to pass over said power supply to adequately dissipate heat therefrom.

20. The apparatus of claim 18 wherein said auxiliary fans are located in a parallel relationship for moving air through said at least one opening.

21. The apparatus of claim 18 wherein said auxiliary fans are located in a serial relationship for moving air through said at least one opening.

22. A method for dissipating heat from a power supply, said power supply enclosed within a housing mounted in a chassis, said housing including at least one opening and a main fan, the method comprising the steps of:

fitting a plenum structure over said at least one opening of said housing in the chassis such that a cavity defined by said plenum receives said housing, and auxiliary fans mounted in said plenum structure are positioned adjacent to and in a stacked relationship with the main fan for moving air through said at least one opening so that air passes over said power supply resulting from operation of the main fan and the auxiliary fans, such that upon malfunction of one of said auxiliary fans, the other auxiliary fan and the main fan enable a sufficient amount of air to pass over said power supply to adequately dissipate heat therefrom; and signaling said malfunction of at least one of said auxiliary fans to a user.

23. The method of claim 22 wherein upon malfunction of said main fan, said auxiliary fans, individually or in combination, operate to enable a sufficient amount of air to pass over said power supply to adequately dissipate heat therefrom.

24. The apparatus of claim 22 wherein said signaling comprises:

detecting malfunction of either of both of said auxiliary fans; and generating a user alert upon said malfunction detection.

* * * * *